United States Patent
Wu et al.

(10) Patent No.: US 7,229,863 B2
(45) Date of Patent: Jun. 12, 2007

(54) METHOD FOR FABRICATING THIN FILM TRANSISTORS

(75) Inventors: Chuan-Yi Wu, Taipei (TW); Yung-Chia Kuan, Taipei (TW); Chia-Chien Lu, Taipei (TW); Chin-Chuan Lai, Taoyuan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 73 days.

(21) Appl. No.: 11/163,602

(22) Filed: Oct. 25, 2005

(65) Prior Publication Data

US 2007/0093003 A1 Apr. 26, 2007

(51) Int. Cl.
*H01L 21/84* (2006.01)

(52) U.S. Cl. ............... 438/158; 438/906; 257/E21.094

(58) Field of Classification Search ........ 438/158–160, 438/906; 257/E21.094
See application file for complete search history.

(56) References Cited

U.S. PATENT DOCUMENTS

| | | | |
|---|---|---|---|
| 5,281,546 A * | 1/1994 | Possin et al. ............... 438/158 |
| 5,821,159 A * | 10/1998 | Ukita ......................... 438/592 |
| 6,410,372 B2 * | 6/2002 | Flewitt ....................... 438/158 |
| 6,495,383 B2 * | 12/2002 | Lyu ............................. 438/30 |
| 6,841,431 B2 * | 1/2005 | Lee et al. ................... 438/158 |
| 2004/0241920 A1 * | 12/2004 | Hsiao et al. ................ 438/158 |

* cited by examiner

*Primary Examiner*—Richard A. Booth
(74) *Attorney, Agent, or Firm*—Jiang Chyun IP Office

(57) ABSTRACT

A method for fabricating a thin film transistor is provided. First, a gate is formed on a substrate. A gate-insulating layer is formed to cover the gate. A patterned semiconductor layer is formed on the gate-insulating layer. A first and a second conductive layer are formed on the patterned semiconductor layer in sequence. The second conductive layer is patterned such that each side of thereof above the gate has a taper profile and the first conductive layer is exposed. A first plasma process is performed to transform the surface and the taper profile of the second conductive layer into a first protection layer. The first conductive layer not covered by the first protection layer and the second conductive layer is removed to form a source/drain. The source/drain is with fine dimensions and the diffusion of metallic ions from the second conductive layer to the patterned semiconductor layer can be avoided.

18 Claims, 8 Drawing Sheets

METHOD FOR FABRICATING THIN FILM TRANSISTORS

BACKGROUND OF THE INVENTION

1. Field of the Invention

The present invention relates to a method for fabricating a thin film transistor. More particularly, the present invention relates to a method for fabricating a thin film transistor having a double metal layer and a fine source/drain dimension using a highly conductive metal.

2. Description of the Related Art

With the rapid development of opto-electronic technologies, digital video and imaging devices have become some of the most common electrical appliances in our daily life. One of the most important man-machine communication interfaces for the digital video or imaging device is the display. A user can easily read information from the display to perform controlling operations.

Thin film transistor (TFT) is a driving device commonly deployed inside a display. Typically, the thin film transistor comprises a gate, a channel and a source/drain. In recent years, the process of forming the source/drain includes depositing a plurality of metallic layers (for example, chromium/aluminum/chromium composite layer or a molybdenum/aluminum/molybdenum composite layer) and performing a wet etching process to pattern the multi-layered metallic layer. However, with the continuous reduction of line widths, a source/drain interconnection using the aforementioned materials often leads to an increase in the resistor-capacitor (RC) delay that the operating speed of the thin film transistor will be slowed down. Thus, using a metallic material with good electrical conductivity to form the source/drain interconnect can minimize the RC delay effect significantly.

Due to the high electrical conductivity, interconnection using copper wires will be a major trend in the future. Yet, the fabrication of copper wires has a few problems: (1) it is difficult to control the dimension of copper patterns in a wet etching operation, and yet, it is hard to etch copper in a dry etching operation; (2) copper ions are easily diffused into surrounding areas leading to a change in the electrical properties of channel layers and/or the contamination of equipment. As a result, copper is often combined with other metals (for example, molybdenum) to form a multi-layered metallic layer in the fabrication of the source/drain.

FIG. 1 is a schematic cross-sectional view of a conventional thin film transistor having a source/drain fabricated using a molybdenum/copper/molybdenum multi-layered metallic layer. As shown in FIG. 1, the thin film transistor 100 comprises a substrate 110, a gate 120, a gate-insulating layer 130, a semiconductor layer 140 and a pair of source/drain 150. The semiconductor layer 140 comprises a channel layer 142 and an ohmic contact layer 144 and the source/drain 150 comprises a molybdenum layer 152, a copper layer 154 and another molybdenum layer 156.

To form the source/drain 150, a patterned photoresist layer 160 is formed over the thin film transistor 100. Then, using the patterned photoresist layer 160 as a mask, a wet etching of the underlying molybdenum layer 156 and the copper layer 154 is carried out. However, because copper has an etching rate greater than molybdenum, the effect of side undercuts 170 is occurred in the wet etching operation as shown in FIG. 1. Thus, the possibility of forming a line cut or a thin film transistor 100 that does not match the dimensional specifications is increased. Furthermore, since the copper layer 154 is dipped inside a pool of etching solution in the wet etching operation, copper ions may diffuse into the nearby semiconductor layer 140 by hitching a ride with the etching solution. Ultimately, the electrical performance of the thin film transistor 100 is affected.

Furthermore, after performing the wet etching operation, a dry etching operation is carried out to remove the molybdenum layer 152 above the gate 120 and a back channel etching (BCE) operation is carried out to remove the ohmic contact layer 144 and a portion of the channel layer 142 above the gate 120.

FIG. 2 is a schematic cross-sectional view showing the dry etching operation for removing the molybdenum layer above the gate and the back channel etching operation. In the dry etching operation, the copper atoms can diffuse into areas in the neighborhood of the semiconductor layer 140 and affect the electrical properties of the semiconductor layer 140 because the copper layer 154 is still exposed in the etching environment. Moreover, since the patterned photoresist layer 160 still serves as a mask in the dry etching operation and the back channel etching operation, a side surface 180 of the molybdenum layer 152, the ohmic contact layer 144 and the channel layer 142 aligns with the edge of the patterned photoresist layer 160. It should be noted that there is a large difference in the dimension between the side surface 180 of the molybdenum layer 152 and the side undercut 170 of the copper layer 154. This causes an unfavorable condition for forming a source/drain 150 with a fine dimension.

SUMMARY OF THE INVENTION

Accordingly, at least one objective of the present invention is to provide a method for fabricating a thin film transistor suitable for forming a source/drain having a multi-layered metallic layer structure and a fine dimension using a metallic material with high conductivity.

To achieve these and other advantages and in accordance with the purpose of the invention, as embodied and broadly described herein, the invention provides a method for fabricating a thin film transistor comprising the following steps. First, a gate is formed on a substrate. Then, a gate-insulating layer is formed on the substrate to cover the gate. Next, a patterned semiconductor layer is formed on the gate-insulating layer above the gate. After that, a first conductive layer and a second conductive layer are sequentially formed on the patterned semiconductor layer. The second conductive layer is patterned such that each side of the second conductive layer above the gate has a taper profile and the first conductive layer is exposed. Then, a first plasma processing is performed to transform the surface and the taper profile of the second conductive layer into a first protection layer. After that, the first conductive layer not covered by the first protection layer and the second conductive layer is removed to form a source/drain.

In one embodiment of the present invention, the material of the second conductive layer includes copper.

In one embodiment of the present invention, the material of the first protection layer includes copper oxide or copper nitride.

In one embodiment of the present invention, the material of the first conductive layer is selected from a group consisting of molybdenum, tungsten molybdenum and tantalum or a combination of them.

In one embodiment of the present invention, the reactive gas for performing the plasma treatment is selected from a group consisting of oxygen, nitrogen, nitrogen dioxide and ammonia or a combination of them.

In one embodiment of the present invention, the method of patterning the second conductive layer includes the following steps. First, a patterned photoresist layer is formed on the substrate to expose the second conductive layer above the gate. Then, using the patterned photoresist layer as a mask, a wet etching operation is performed to etch the second conductive layer until the first conductive layer is exposed and the etched second conductive layer has a taper profile.

In one embodiment of the present invention, the step of removing the first conductive layer not covered by the protection layer and the second conductive layer includes performing a dry etching operation. The gas used in the dry etching operation is selected from a group consisting of hexafluorosulfide ($SF_6$), oxygen ($O_2$), chlorine ($Cl_2$), hydrogen chloride (HCl) and trifluoromethane ($CHF_3$) or a combination of them.

In one embodiment of the present invention, the patterned semiconductor layer comprises a patterned channel layer and a patterned ohmic contact layer. Furthermore, the patterned ohmic contact layer is disposed on the patterned channel layer.

In one embodiment of the present invention, the method of fabricating the thin film transistor also includes performing a back channel etching operation to remove the patterned ohmic contact layer and a portion of the patterned channel layer above the gate.

In one embodiment of the present invention, the method of forming a gate on the substrate includes the following steps. First, a third conductive layer and a fourth conductive layer are sequentially formed on the substrate. Then, the fourth conductive layer is patterned. After that, a second plasma treatment is carried out to transform the surface of the fourth conductive layer into a second protection layer. Then, the third conductive layer not covered by the second protection layer and the fourth conductive layer is removed to form the gate.

In one embodiment of the present invention, the material of the fourth conductive layer includes copper.

In one embodiment of the present invention, the material of the second protection layer includes copper oxide or copper nitride.

In one embodiment of the present invention, the material of the third conductive layer is selected from a group consisting of molybdenum, tungsten molybdenum and tantalum or a combination of them.

In one embodiment of the present invention, the reactive gas for performing the second plasma treatment is selected from a group consisting of oxygen, nitrogen, nitrogen dioxide and ammonia or a combination of them.

In one embodiment of the present invention, the step of removing the third conductive layer not covered by the second protection layer and the fourth conductive layer includes performing a dry etching operation. The gas used in the dry etching operation is selected from a group consisting of hexafluorosulfide ($SF_6$), oxygen ($O_2$), chlorine ($Cl_2$), hydrogen chloride (HCl) and trifluoromethane ($CHF_3$) or a combination of them.

In one embodiment of the present invention, the method of patterning the fourth conductive layer includes performing a photolithographic process and a wet etching operation.

In the present invention, materials such as copper and molybdenum having good electrical conductivity are used to fabricate a double metal layer source/drain. Furthermore, a plasma treatment is carried out to process the surface of the copper layer so that the copper layer on the upper layer can be used as a mask for dry-etching the underlying molybdenum layer and the channel layer. Thus, the method of fabricating the thin film transistor according to the present invention can prevent the occurrence of side undercuts on the copper layer and thus produce source/drain with a fine dimension. Moreover, the higher electrical conductivity of a copper layer is able to minimize resistor-capacitor (RC) delay so that the thin film transistor can have a higher operating speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
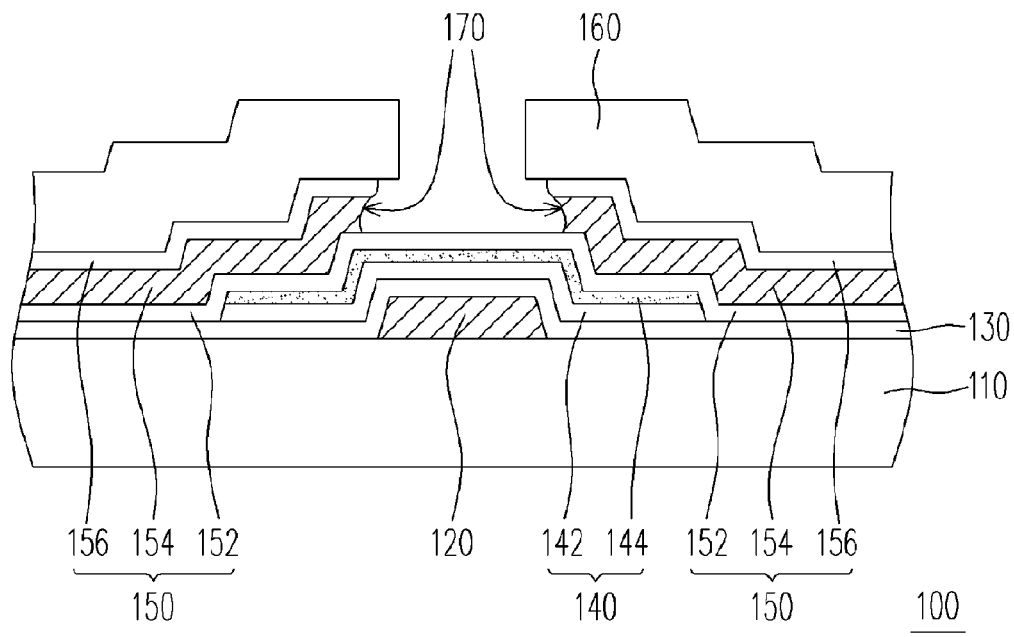
FIG. 1 is a schematic cross-sectional view of a conventional thin film transistor having a source/drain fabricated using a molybdenum/copper/molybdenum multi-layered metallic layer.
Figure 2:
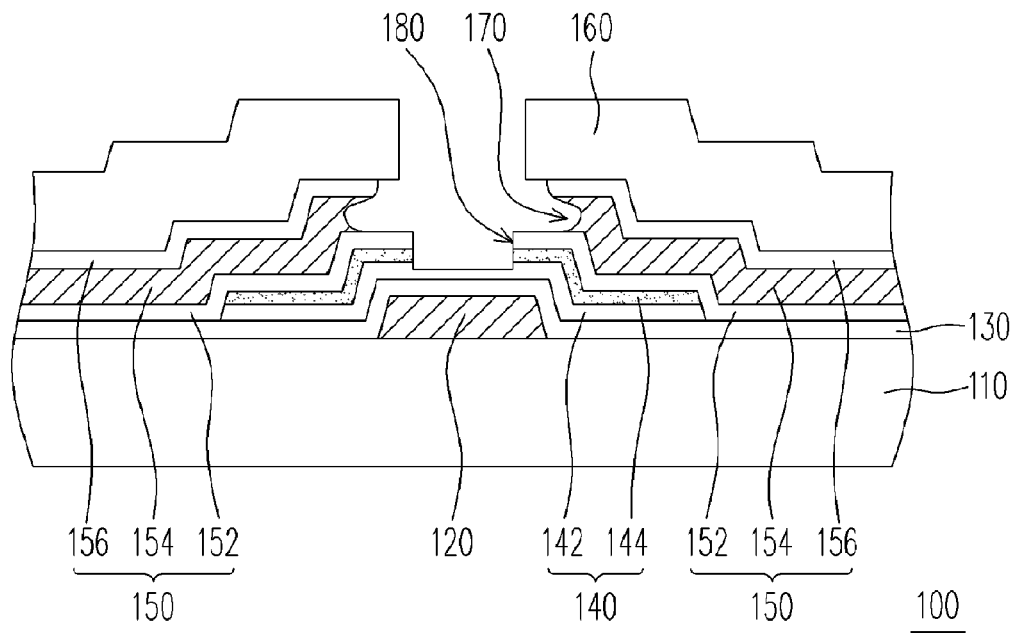
FIG. 2 is a schematic cross-sectional view showing the dry etching operation for removing the molybdenum layer above the gate and the back channel etching operation.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
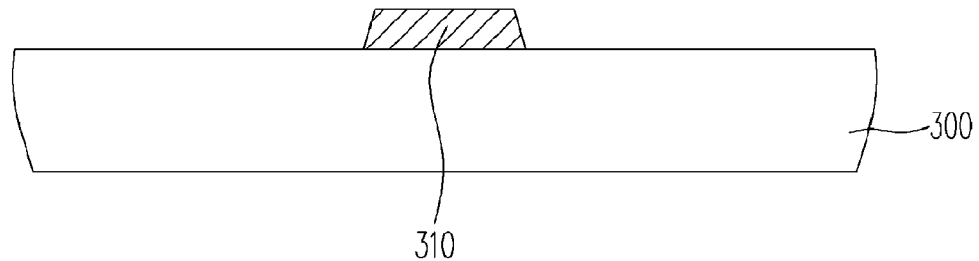
FIGS. 3A through 3J are schematic cross-sectional views showing the steps for fabricating a thin film transistor according to one preferred embodiment of the present invention.

FIGS. 3A through 3J are schematic cross-sectional views showing the steps for fabricating a thin film transistor according to one preferred embodiment of the present invention. First, a gate 310 is formed on a substrate 300 as shown in FIG. 3A. In one embodiment of the present invention, the method of forming the gate 310 is described in FIGS. 4A through 4E. First, as shown in FIG. 4A, a first conductive layer 210 and a second conductive layer 220 are sequentially formed on the substrate 300. The method of forming the conductive layer 210 and 220 includes, for example, performing a sputtering or an evaporation process. The conductive layer 210 is fabricated using a low contact resistant, high adhesion metal. In one embodiment, the material constituting the conductive layer 210 is selected from a group consisting of molybdenum, tungsten molybdenum and tantalum or a combination of them. On the other hand, the conductive layer 220 is fabricated using a low resistant, highly conductive metal. In one embodiment, the conductive layer 220 is fabricated using copper, for example. However, the conductive layer 220 can also be fabricated using silver or gold.

Figure 4A:
FIGS. 4A through 4E are schematic cross-sectional views showing the steps for fabricating a gate according to one embodiment of the present invention.
Figure 4B:
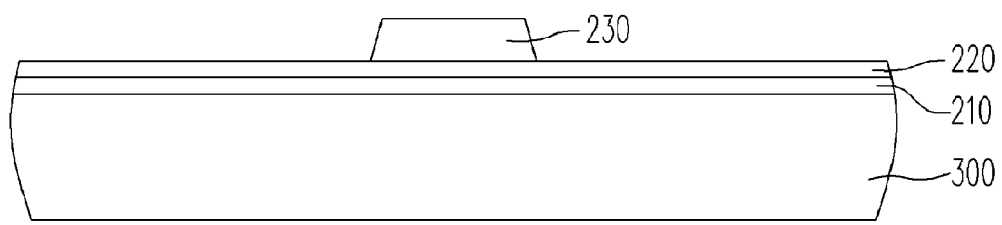

As shown in FIG. 4B, the conductive layer 220 is patterned. In one embodiment of the present invention, the method of patterning the conductive layer 220 includes performing a photolithographic process and a wet etching operation. First, a photoresist layer 230 is formed over the conductive layer 220 by performing a photolithographic process. Then, using the photoresist layer 230 as a mask, a wet etching operation of the conductive layer 220 is carried out to form the patterned conductive layer 220 as shown in FIG. 4C.

Figure 4C:
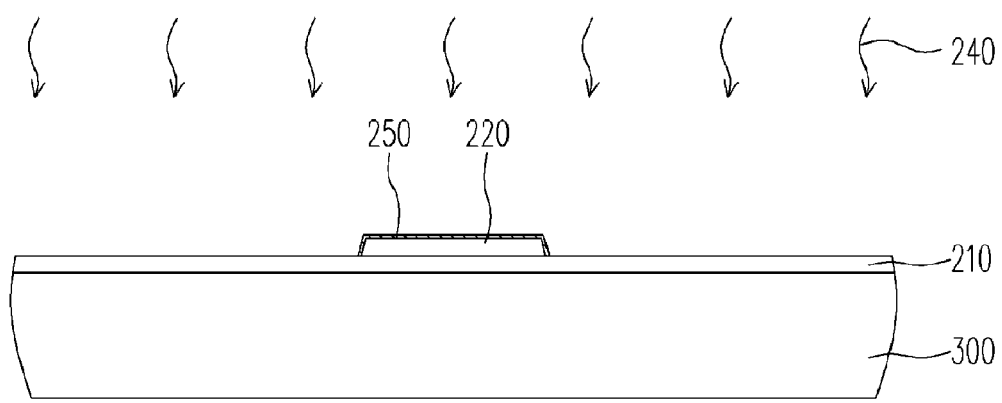

Next, as shown in FIG. 4C, a plasma treatment 240 is carried out to form a protection layer 250 on the surface of the conductive layer 220. In one embodiment of the present invention, the reactive gas used in the plasma treatment 240 is selected from a group consisting of oxygen, nitrogen, nitrogen dioxide and ammonia or a combination of them. The plasma generated from the reactive gas can react with the surface of the conductive layer 220. As a result, the material of the protection layer 250 can be copper oxide or copper nitride, for example.

Figure 4D:
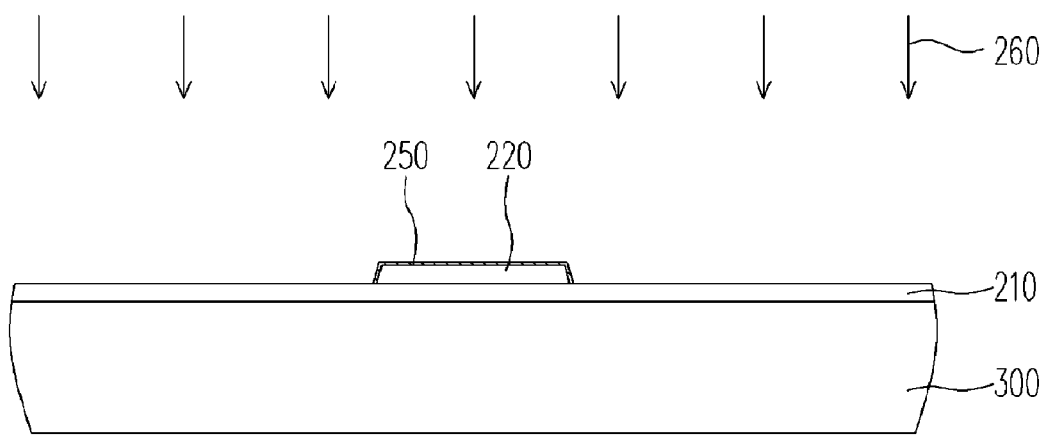
Figure 4E:
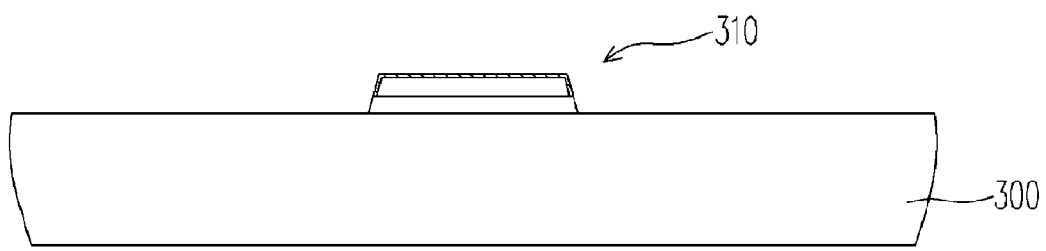

As shown in FIG. 4D, the conductive layer 210 not covered by the protection layer 250 and the conductive layer 220 is removed to form a gate 310 as shown in FIG. 4E. In one embodiment of the present invention, the method of removing the conductive layer 210 not covered by the protection layer 250 and the conductive layer 220 includes performing a dry etching operation 260, for example. Furthermore, the gas used in the dry etching operation 260 is selected from a group consisting of hexafluorosulfide ($SF_6$), oxygen ($O_2$), chlorine ($Cl_2$), hydrogen chloride (HCl) and trifluoromethane ($CHF_3$) or a combination of them.

Figure 3B:
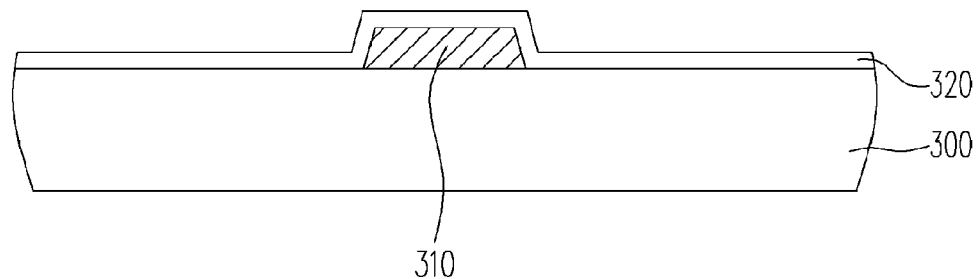

After forming the gate 310, a gate-insulating layer 320 is formed on the substrate 300 to cover the gate 310 as shown in FIG. 3B. In one embodiment of the present invention, the method of forming the gate-insulating layer 320 includes performing a chemical vapor deposition (CVD) process. Furthermore, the gate-insulating layer 320 is fabricated using silicon nitride or silicon oxide, for example.

Figure 3C:
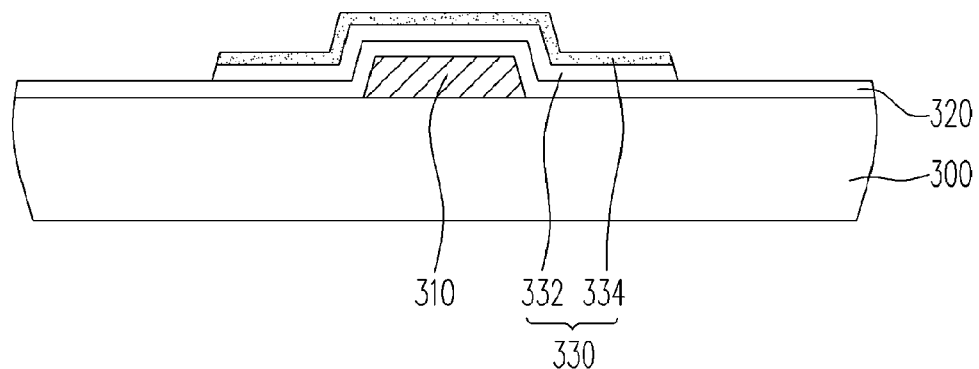

As shown in FIG. 3C, a patterned semiconductor layer 330 is formed on the gate-insulating layer 320 above the gate 310. In one embodiment of the present invention, the method of forming the patterned semiconductor layer 330 includes sequentially depositing channel material and ohmic contact material and patterning the ohmic contact material layer (not shown) and the channel material layer (not shown) thereafter. The patterned semiconductor layer 330 in FIG. 3C comprises a patterned channel layer 332 and a patterned ohmic contact layer 334, for example. Moreover, the patterned ohmic contact layer 334 is disposed on the patterned channel layer 332.

Figure 3D:
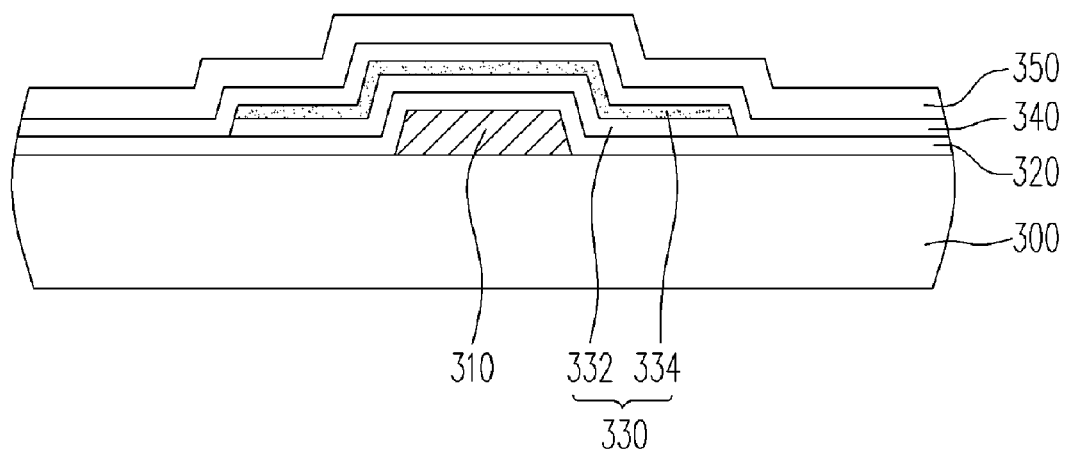

As shown in FIG. 3D, a first conductive layer 340 and a second conductive layer 350 are sequentially formed over the patterned semiconductor layer 330. In one embodiment of the present invention, the method of forming the conductive layers 340 and 350 includes performing a sputtering or an evaporation process, for example. The first conductive layer 340 is fabricated using a low contact resistant, high adhesion metal. In one embodiment, the material constituting the first conductive layer 340 is selected from a group consisting of molybdenum, tungsten molybdenum and tantalum or a combination of them. On the other hand, the second conductive layer 350 is fabricated using a low resistant, high conductivity metal. In one embodiment, the material constituting the second conductive layer 350 includes copper, for example, but can be silver or gold.

Figure 3E:
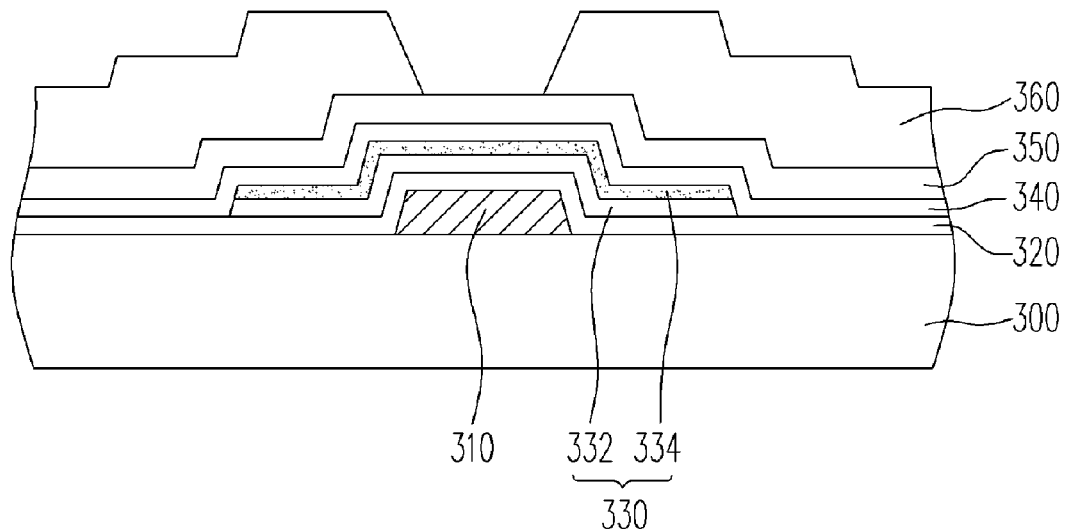
Figure 3F:
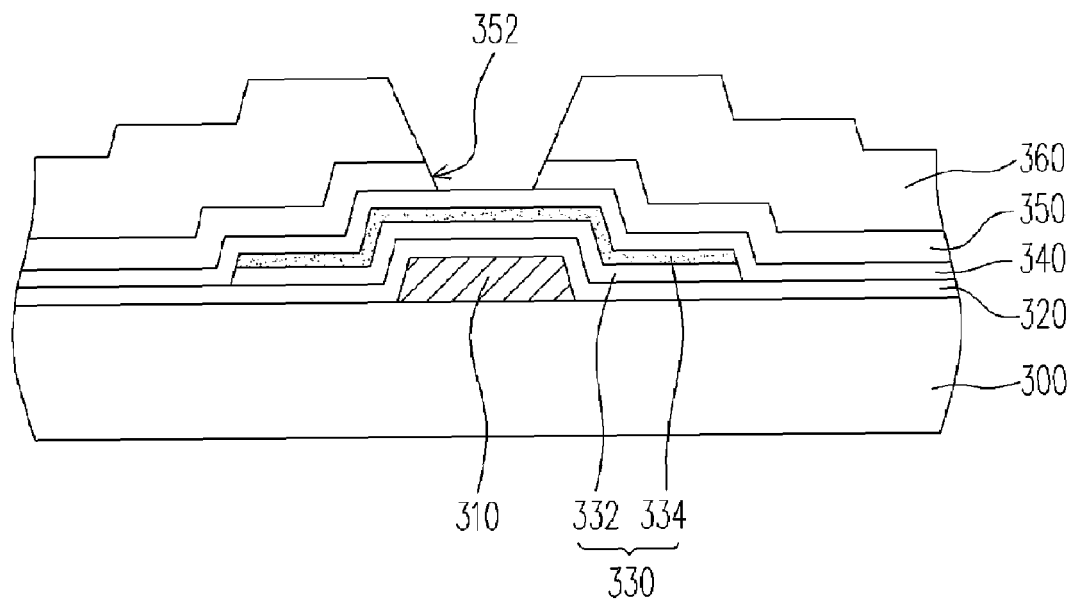
Figure 3G:
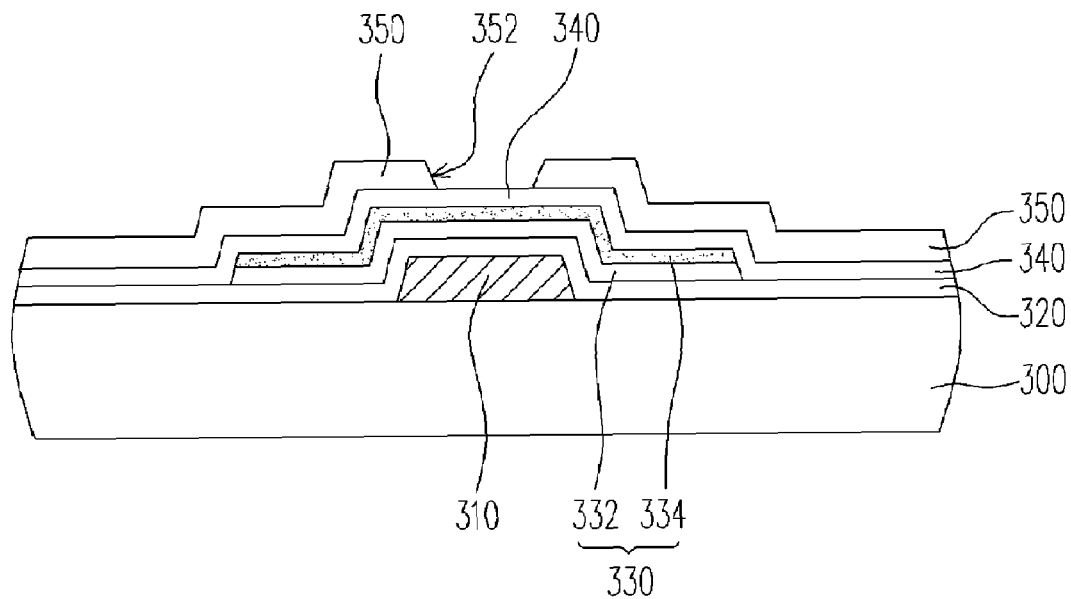

Then, the conductive layer 350 is patterned so that the two sides of the conductive layer 350 above the gate 310 have a taper profile 352 and expose the conductive layer 340 as shown in FIG. 3G. In one embodiment of the present invention, the process of patterning the conductive layer 350 is shown in FIGS. 3E to 3G. First, as shown in FIG. 3E, a patterned photoresist layer 360 is formed on the substrate 300. The patterned photoresist layer exposes the conductive layer 350 above the gate 310. Then, as shown in FIG. 3F, a wet etching operation is carried out using the patterned photoresist layer 360 as a mask until the conductive layer 340 is exposed and the taper profile 352 is formed in the etched conductive layer 350. Finally, the patterned photoresist layer 360 is removed as shown in FIG. 3G.

Figure 3H:
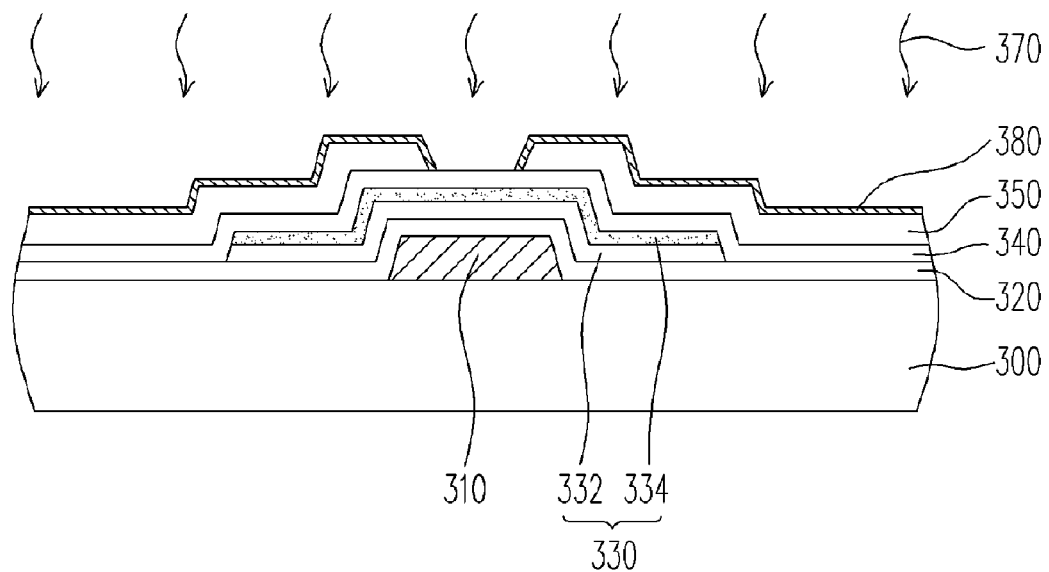

As shown in FIG. 3H, a plasma treatment 370 is carried out to form a protection layer 380 on the surface of the conductive layer 350 and the taper profile 352. In one embodiment of the present invention, the reactive gas for performing the plasma treatment 370 is selected from a group consisting of oxygen, nitrogen, nitrogen dioxide and ammonia or a combination of them. As a result, the material of the protection layer 380 is copper oxide or copper nitride, for example. Furthermore, the plasma treatment 370 is carried out at a temperature between room temperature (25° C.)~380° C., and the power rating for performing the plasma treatment 370 is set between 50 W~5 KW. They changes with process pressure, mixture gas rate, and gas flow rate, respectively.

It should be noted that the step of transforming the surface of the conductive layer 350 into the protection layer 380 in the plasma treatment 370 permits the direct use of the protection layer 380 as a mask in dry etching the conductive layer 340 underneath the conductive layer 350. Hence, the pattern dimension between the first conductive layer 340 and the second conductive layer 350 will be very close and resolve the problem of having large dimensional difference between the layers in the conventional multi-layered metallic layer.

Figure 3I:
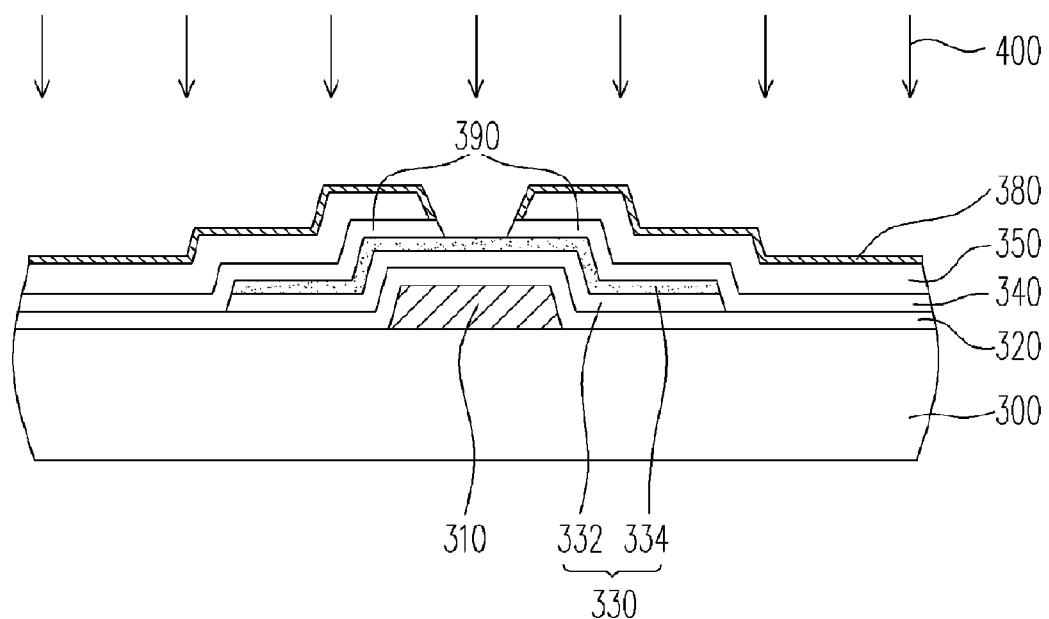

As shown in FIG. 3I, the first conductive layer 340 not covered by the protection layer 380 and the second conductive layer 350 is removed to form source/drain 390. In one embodiment of the present invention, the process of removing the conductive layer 340 not covered by the protection layer 380 and the conductive layer 350 includes performing a dry etching operation 400. The gas used in the dry etching operation 400 is selected from a group consisting of hexafluorosulfide ($SF_6$), oxygen ($O_2$), chlorine ($Cl_2$), hydrogen chloride (HCl) and trifluoromethane ($CHF_3$) or a combination of them, for example. It should be noted that the material (such as copper) in the conductive layer 350 would not be released in the dry etching operation 400 because the protection layer 380 covers the conductive layer 350. Therefore, the electrical performance of the patterned semiconductor layer 330 will not be affected.

Figure 3J:
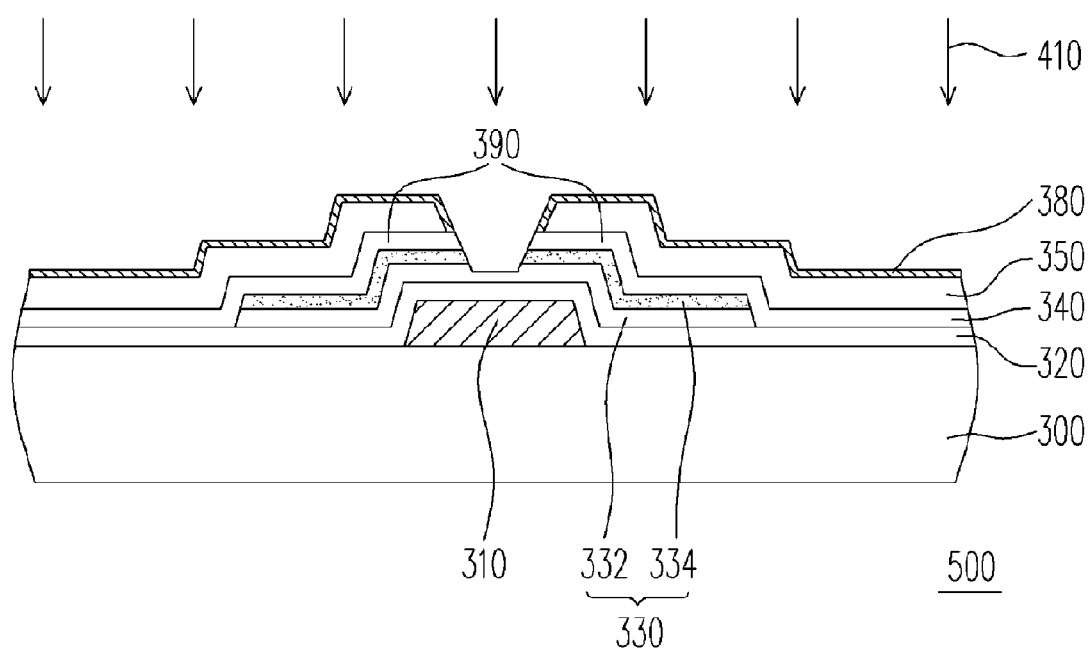

As shown in FIG. 3J, in one embodiment of the present invention, the aforementioned method of fabricating the thin film transistor further includes performing a channel back etching operation 410. The channel back etching operation removes the patterned ohmic contact layer 334 above the gate 310 and a portion of the patterned channel layer 332. Up to this point, the process of fabricating a thin film transistor 500 is completed.

In summary, the method of fabricating thin film transistors in the present invention has the following advantages.

1. The effect of side undercuts on the copper conductive layer is prevented so that the source/drain can have a finer dimension.

2. By forming a protection layer over the copper conductive layer in a plasma treatment, copper is prevented from releasing and contaminating the channel layer; ultimately, electrical performance of the semiconductor layer will not be affected because of copper.

3. The present invention uses the copper wire interconnection technique to fabricate the source/drain of a thin film transistor. The better electrical conductivity of copper can solve the prior art resistor-capacitor time delay problem so that the thin film transistor can operate at a higher speed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a thin film transistor, comprising the steps of:
   providing a substrate;
   forming a gate on the substrate;
   forming a gate-insulating layer on the substrate to cover the gate;
   forming a patterned semiconductor layer on the gate-insulating layer and above the gate;
   forming a first conductive layer and a second conductive layer in sequence on the patterned semiconductor layer;
   patterning the second conductive layer to form a taper profile on the respective sides of the second conductive layer above the gate and expose the first conductive layer;
   performing a first plasma treatment to form a first protection layer on the surface of the second conductive layer and the taper profile area; and
   removing the first conductive layer not covered by the first protection layer and the second conductive layer to form a source/drain.

2. The method of claim 1, wherein the material constituting the second conductive layer includes copper.

3. The method of claim 1, wherein the material constituting the first protection layer includes copper oxide or copper nitride.

4. The method of claim 1, wherein the material constituting the first conductive layer is selected from a group consisting of molybdenum, tungsten molybdenum and tantalum or a combination of the above.

5. The method of claim 1, wherein the reactive gas used in the first plasma treatment is selected from a group consisting of oxygen, nitrogen, nitrogen dioxide and ammonia or a combination of the above.

6. The method of claim 1, wherein the steps of patterning the second conductive layer include:
   forming a patterned photoresist layer on the substrate to expose the second conductive layer above the gate; and
   performing a wet etching operation to etch the second conductive layer using the patterned photoresist layer as a mask until the first conductive layer is exposed and the taper profile is formed on the etched second conductive layer.

7. The method of claim 1, wherein the step of removing the first conductive layer not covered by the first protection layer and the second conductive layer includes performing a dry etching operation.

8. The method of claim 7, wherein the gas used in the dry etching operation is selected from a group consisting of hexafluorosulfide ($SF_6$), oxygen ($O_2$), chlorine ($Cl_2$), hydrogen chloride (HCl) and trifluoromethane ($CHF_3$) or a combination of the above.

9. The method of claim 1, wherein the patterned semiconductor layer comprises a patterned channel layer and a patterned ohmic contact layer and the patterned ohmic contact layer is disposed on the patterned channel layer.

10. The method of claim 9, wherein the fabrication process further includes performing a back channel etching operation to remove the patterned ohmic contact layer above the gate and a portion of the patterned channel layer.

11. The method of claim 1, wherein the steps of forming the gate on the substrate include:
    forming a third conductive layer and a fourth conductive layer in sequence on the substrate;
    patterning the fourth conductive layer;
    performing a second plasma treatment to form a second protection layer on the surface of the fourth conductive layer; and
    removing the third conductive layer not covered by the second protection layer and the fourth conductive layer to form the gate.

12. The method of claim 11, wherein the material constituting the fourth conductive layer includes copper.

13. The method of claim 11, wherein the material constituting the second protection layer includes copper oxide or copper nitride.

14. The method of claim 11, wherein the material constituting the third conductive layer is selected from a group consisting of molybdenum, tungsten molybdenum and tantalum or a combination of the above.

15. The method of claim 11, wherein the reactive gas used in the second plasma treatment is selected from a group consisting of oxygen, nitrogen, nitrogen dioxide and ammonia or a combination of the above.

16. The method of claim 11, wherein the step of removing the third conductive layer not covered by the second protection layer and the fourth conductive layer includes performing a dry etching operation.

17. The method of claim 16, wherein the gas used in the dry etching operation is selected from a group consisting of hexafluorosulfide ($SF_6$), oxygen ($O_2$), chlorine ($Cl_2$), hydrogen chloride (HCl) and trifluoromethane ($CHF_3$) or a combination of the above.

18. The method of claim 11, wherein the step of patterning the fourth conductive layer includes performing a photolithographic process and a wet etching operation.

* * * * *